United States Patent [19]

Page

[11] 4,132,963
[45] Jan. 2, 1979

[54] GAIN CONTROLLED SIGNAL AMPLIFIER

[75] Inventor: Ronald W. Page, Sunnyvale, Calif.

[73] Assignee: National Semiconductor Corporation, Santa Clara, Calif.

[21] Appl. No.: 851,014

[22] Filed: Nov. 14, 1977

[51] Int. Cl.² ............................................. H03G 3/30
[52] U.S. Cl. .................................. 330/283; 330/288; 330/296; 330/311
[58] Field of Search ............... 330/278, 283, 285, 288, 330/296, 310, 311; 325/319, 413, 414; 358/27

[56] References Cited
U.S. PATENT DOCUMENTS

| | | | |
|---|---|---|---|
| 3,303,428 | 2/1967 | Zentmaier et al. | 330/283 |
| 3,491,306 | 1/1970 | Nielsen | 330/283 |
| 3,538,448 | 11/1970 | Harford | 330/283 |

Primary Examiner—James B. Mullins
Attorney, Agent, or Firm—Gail W. Woodward

[57] ABSTRACT

A high gain integrated circuit amplifier is arranged in the form of a pair of cascaded common emitter stages. A current mirror is employed to track the stage currents. A high gain d-c negative feedback loop is employed to stabilize the amplifier, and each stage employs emitter diode degeneration to control gain as a function of current. Gain control is obtained by sinking current at a single node in one stage.

11 Claims, 2 Drawing Figures

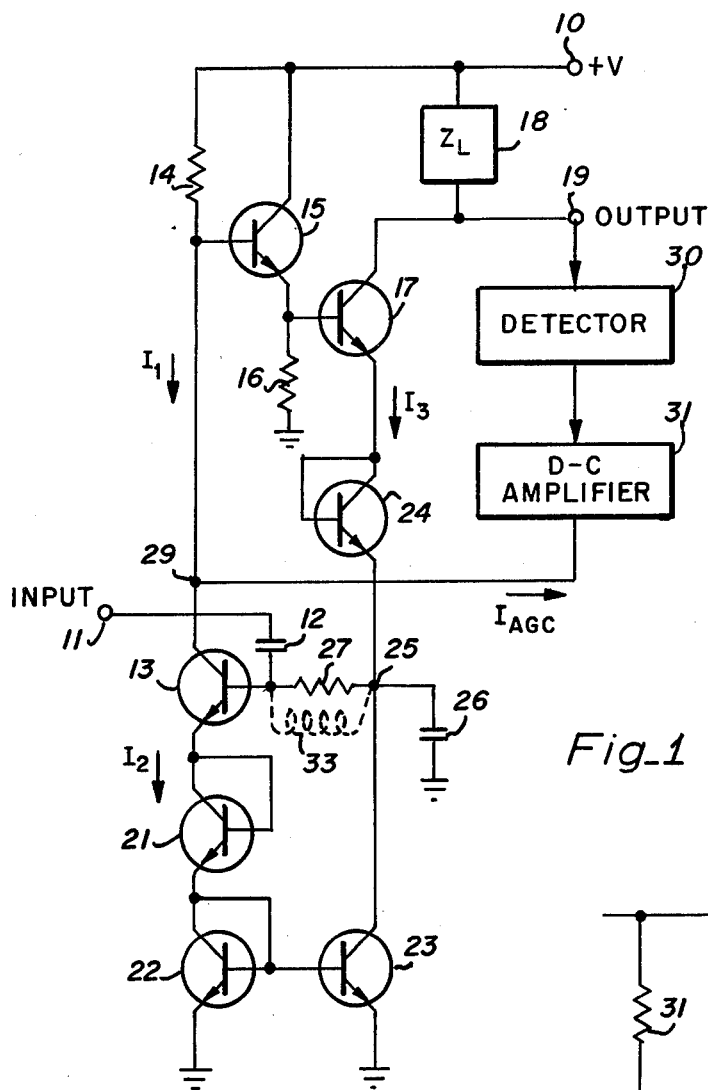
Fig_1
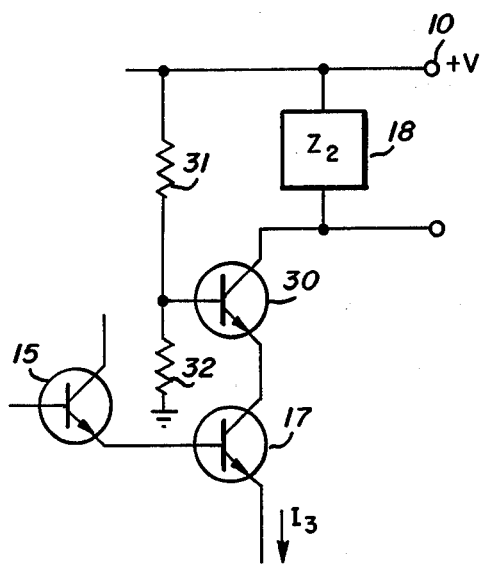
Fig_2

GAIN CONTROLLED SIGNAL AMPLIFIER

BACKGROUND OF THE INVENTION

The invention relates to signal amplifying circuits such as the r-f and i-f amplifiers found in radio receivers. The circuit is adapted for integrated circuit (IC) construction, and represents a variable gain block that can be employed singly or cascaded as desired. Prior art circuits often tended to become unstable, particularly with the application of automatic gain control (AGC). Accordingly, the prior art AGC circuits have been complicated and the circuits difficult to temperature compensate. In addition, the prior art circuits tend to overload in the presence of strong signals.

SUMMARY OF THE INVENTION

It is an object of the invention to provide an IC amplifier circuit having a single terminal wide range gain control action.

It is a further object of the invention to provide a simple temperature compensated, d-c stabilized, signal amplifier in IC form that has wide AGC range and responds to strong signals without overloading.

These and other objects are achieved in an amplifier circuit configured as follows. A first common emitter gain stage is emitter follower coupled to a second common emitter gain stage. The two gain stages are operated from a current mirror so that their currents track and both stages employ forward biased diode emitter resistance degeneration to control gain as a function of current. A d-c negative feedback loop is employed to stabilize the two stages. Gain control is applied by current sinking a single circuit node to provide a large control range. By cascading a plurality of forward biased diodes in the emitter of the input stage, signal overload is substantially reduced.

BRIEF DESCRIPTION OF THE DRAWING

FIG. 1 is a schematic diagram of the circuit of the invention, and

FIG. 2 is a fragmentary schematic diagram of an improved portion of the circuit of FIG. 1.

DESCRIPTION OF THE INVENTION

In the description that follows, a rigorous transistor current analysis will be avoided. The approximate description is sufficiently accurate to determine how the circuit and the invention operate. For example, in describing transistor action to a first approximation, base currents can be neglected. Since the base current in a typical transistor in its active state will be on the order of 0.5% of the collector current, ignoring the base current will not introduce serious error.

In the circuit of FIG. 1, power is supplied at +V, terminal 10, with respect to ground. An input signal at terminal 11 is coupled by capacitor 12 to the base of transistor 13 which acts as the first gain stage. Resistor 14 acts as the load for transistor 13. Emitter follower transistor 15 with its output load resistor 16 couples the output from transistor 13 to the base of transistor 17 at substantially unity voltage gain. Transistor 17 is the second gain stage and employs $Z_L$ at 18 as its output load. $Z_L$ is typically an antiresonant tank circuit which establishes the amplifier frequency characteristics. Terminal 19 comprises the amplifier output.

The emitter of transistor 13 is returned to ground through a pair of diode connected transistors 21 and 22. These diodes are forward biased, and conduct the emitter current of transistor 13. Diodes 21 and 22 each present a series resistance known as $r_e$ which is defined as the forward biased emitter junction resistance. Its value will be:

$$r_e = \frac{kT}{Iq} \quad (1)$$

where:
k = Boltzmanns constant
T = Absolute temperature
q = Charge on an electron; and
I = Current flow The resistance $r_e$ is relatively small, typically 26 ohms at 25° C and at one ma., and decreases with increasing current.

Transistors 22 and 23 are connected as a conventional current mirror. Thus, any current flowing in diode connected transistor 22 will be tracked as collector current in transistor 23. If the emitter areas of transistors 22 and 23 are the same, the emitter current of transistor 23 will equal the emitter current of transistor 22. Typically, these two emitters are made equal, but, if desired can be ratioed.

Diode connected transistor 24 returns the emitter of transistor 17 to circuit node 25 which is at signal ground by virtue of signal bypass capacitor 26. Resistor 27 returns the base of transistor 13 to circuit node 25. As indicated in dashed outline at 33, resistor 27 can be shunted or replaced by an inductor. If desired, inductor 33 can be the secondary winding of an input transformer, the primary of which constitutes the circuit input terminals. In this latter case, capacitor 12 would be omitted.

Circuit node 29 is the automatic gain control (AGC) terminal. Current labeled $I_{AGC}$ sunk out of terminal 29 to ground will act to reduce the overall amplifier gain. The AGC action requires a detector 30 and a d-C amplifier 31, shown in block form, to complete the circuit.

The gain stages, which involve transistors 13 and 17, are stabilized by a negative d-c feedback loop. It can be seen that the collector of transistor 13 is directly coupled via transistors 15, 17, and 24 and resistor 27 (or inductor 33) back to its base. Since this loop involves no inversions, the feedback is negative. Bypass capacitor 26 acts as a signal ground for node 25 and ensures that the negative feedback is only present at low frequencies and not for signal frequencies.

It can be seen that circuit node 25 is $3V_{BE}$ above ground due to transistors 13, 21, and 22. Circuit node 29 is $3V_{BE}$ above circuit node 25 due to transistors 15, 17, and 24. Accordingly:

$$I_1 = \frac{+V - 6V_{BE}}{R14} \quad (2)$$

where:
+V is the supply potential; and R14 is the value of resistor 14.

An inspection of the circuit at node 29 shows that:

$$I_2 = I_1 - I_{AGC} \quad (3)$$

By virtue of the current mirror action of transistors 22 and 23, $I_3$ equals $I_2$.

The gain of transistor 13 is:

$$A_{13} = \frac{R14}{3r_e} \quad (4)$$

where:
R14 is the resistance of resistor 14; and $3r_e$ is the emitter resistances of series connected transistors 13, 21, and 22.

The gain of transistor 17 is:

$$A_{17} = \frac{Z_L}{2r_e} \quad (5)$$

where:
$Z_L$ is the impedance of load 18; and $2r_e$ is the emitter resistances of transistors 17 and 24.

The overall gain between terminals 11 and 19 is the cascaded gain of transistors 13 and 17 which is:

$$A = \frac{Z_L R14}{6r_e^2} \quad (6)$$

Equation (6) shows that substantial overall gain is available because $Z_L$ and R14 can be made extremely large compared with $6r_e^2$. Equation (5) further shows that since $r_e$ is a function of current, the gain can be varied strongly as a function of current due to the $6r_e^2$ term. From a circuit standpoint it can be seen that transistor 13 has its gain degenerated by three series connected $r_e$ values. Transistor 17 will have its gain degenerated by two series connected $r_e$ values. The cascade then responds to the square of the $r_e$ value.

As $I_{AGC}$ is pulled out of circuit node 29, $I_2$ and hence $I_3$ will be decreased by the magnitude of $I_{AGC}$. This causes $r_e$ to increase and the amplifier gain will be reduced in proportion to the square of $r_e$. Since three $r_e$ drops appear in the emitter circuit of transistor 13, and these values rise with increasing signal at terminal 11, the amplifier is highly resistant to overloading.

From the above, it can be seen that a single circuit node is used to gain control the amplifier. The amplifier is extremely stable, difficult to overload, and highly responsive to AGC action.

The circuit of FIG. 1 was fabricated in conventional IC form using state of the art devices and components. The transistors were of the NPN variety with Beta values of about 200. Capacitors 12 and 26, $Z_L$ 18, and resistor 27 were located off chip.

The following component values were employed:

| | |
|---|---|
| Capacitor 12 | .01 microfarads |
| Resistor 14 | 2K Ohms |
| Resistor 16 | 3.6K Ohms |
| Load 18 | 455 KHz antiresonant circuit $Z_L$ = 35K Ohms |
| Capacitor 26 | 5 microfarads |
| Resistor 27 | 2K Ohms |

The circuit operated from a 8-volt supply.

The zero signal value of $I_1$ was about 2 ma. The circuit had a small signal gain of 97 db, an AGC range in excess of 90 db, and an overload level of about 100 millivolts.

For the circuit of the example, node 29 will operate at about 4 volts above ground at 25° C. If tamperature rises, the amplifier gain will tend to fall as $r_e$ has a positive coefficient. However, the potential at node 29 will decrease and cause a compensating increase in current through resistor 14 or $I_1$, and hence $I_2$ and $I_3$. This increased current will reduce $r_e$ of transistors 13, 21, 22, 17, and 24 so as to increase gain. For the conditions shown in the example, the gain will be substantially compensated.

FIG. 2 shows a useful modification of the circuit of FIG. 1. Transistor 30 is coupled in series with the collector of transistor 17 and two resistors 31 and 32 from a voltage divider to set the base voltage of transistor 30. This cascode amplifier connection improves the performance of the gain stage by reducing Miller effect capacitance loading at the base of transistor 17. This substantially increases the high frequency gain of the amplifier.

Clearly, there are other modifications and equivalents that could be applied within the spirit and intent of the invention. For example, diode connected transistors 21 and 24 could be omitted with an attendant reduction in AGC and overload performance. Additional diode connected transistors could be added in series with transistors 21 and 24 with further performance improvements. However, the addition of more diode connected transistors produces diminishing performance increases.

Accordingly, it is intended that the invention be limited in scope by the claims that follow.

I claim:
1. A transistor amplifier circuit comprising:
first and second common emitter amplifying stages,
means for cascade connecting said first and second stages,
means responsive to current flowing in said first stage for causing the current flowing in said second stage to track said current flowing in said first stage and
means for controlling directly only said current flowing in said first stage whereby the gain of both of said stages is varied in the same direction in response to said means for controlling.

2. The amplifier circuit of claim 1 further comprising means for providing direct current negative feedback around said cascaded stages to stabilize said amplifier.

3. The amplifier circuit of claim 2 wherein said first and second stages further include diodes coupled in series with the stage emitters and poled to conduct in the forward direction whereby current sensitive emitter degeneration is enhanced.

4. The amplifier circuit of claim 3 wherein said first stage includes at least two diodes coupled in series with the emitter of said first stage whereby the overload characteristic of said amplifier is enhanced.

5. The amplifier of claim 2 wherein said second stage comprises a pair of cascode connected transistors.

6. The amplifier of claim 1 wherein said means for causing the current flowing in said second stage to track said current flowing in said first stage comprise a current mirror.

7. An amplifier circuit comprising:
first and second terminals adapted for connection to a power supply;
a first transistor having a base coupled to signal input terminal means, an emitter coupled through forward biased diode means to said first terminal, and a collector coupled through first load means to said second terminal;
a second transistor having a collector, an emitter coupled to said first terminal and a base coupled to said forward biased diode means to form a current mirror wherein said second transistor collector provides a current sink that tracks the current in said first transistor;

a third transistor having an emitter coupled to the collector of said second transistor, a collector coupled to signal output means, and a base coupled to said collector of said first transistor; and load means coupled between said second terminal and said collector of said third transistor.

8. The amplifier of claim 7 wherein said collector of said first transistor is coupled to said base of said third transistor by means of a fourth transistor having a collector coupled to said second terminal, an emitter coupled to said base of said third transistor, and a base coupled to the collector of said first transistor.

9. The amplifier circuit of claim 8 wherein said collector of said second transistor includes means for alternating current signal bypassing to said first terminal.

10. The amplifier circuit of claim 9 wherein said base of said first transistor is coupled to means for providing a direct current return to said collector of said second transistor.

11. The amplifier circuit of claim 10 wherein said emitter of said fourth transistor is coupled to said first terminal through current conductive means.

* * * * *